United States Patent
Locke et al.

(10) Patent No.: US 12,388,068 B2
(45) Date of Patent: Aug. 12, 2025

(54) ELECTRODE PRODUCTION PROCESS

(71) Applicant: GELION TECHNOLOGIES PTY LTD, Eveleigh (AU)

(72) Inventors: Jacob Locke, Abingdon (GB); Jokin Rikarte, Abingdon (GB); Marco Carboni, Abingdon (GB)

(73) Assignee: Gelion Technologies Pty Ltd, Eveleigh (AU)

( * ) Notice: Subject to any disclaimer, the term of this patent is extended or adjusted under 35 U.S.C. 154(b) by 78 days.

(21) Appl. No.: 17/996,684

(22) PCT Filed: Apr. 19, 2021

(86) PCT No.: PCT/GB2021/050931
§ 371 (c)(1),
(2) Date: Oct. 20, 2022

(87) PCT Pub. No.: WO2021/214438
PCT Pub. Date: Oct. 28, 2021

(65) Prior Publication Data
US 2023/0327067 A1    Oct. 12, 2023

(30) Foreign Application Priority Data

Apr. 20, 2020    (GB) ..................................... 2005746

(51) Int. Cl.
*H01M 4/04*    (2006.01)

(52) U.S. Cl.
CPC ................................. *H01M 4/0404* (2013.01)

(58) Field of Classification Search
CPC ....................................................... H01M 4/04
See application file for complete search history.

(56) References Cited

U.S. PATENT DOCUMENTS

| | | | |
|---|---|---|---|
| 2002/0086213 A1 | 7/2002 | Utsugi et al. | |
| 2009/0165710 A1 | 7/2009 | Kee et al. | |
| 2014/0162108 A1 | 6/2014 | Visco et al. | |
| 2014/0220233 A1* | 8/2014 | Huang | ................ H01M 50/461 427/58 |
| 2015/0170947 A1 | 6/2015 | Bluck et al. | |
| 2017/0229731 A1 | 8/2017 | Visco et al. | |

FOREIGN PATENT DOCUMENTS

| | | |
|---|---|---|
| EP | 1 234 348 B1 | 10/2003 |
| EP | 3 413 380 A1 | 12/2018 |
| JP | H11-67208 A | 3/1999 |

* cited by examiner

*Primary Examiner* — Austin Murata
(74) *Attorney, Agent, or Firm* — BakerHostetler

(57) ABSTRACT

A method for forming at least one alkali metal or alkaline earth metal electrode, said method comprising: a) providing a metal foil; b) cutting the metal foil to form at least one electrode; c) placing an electrode on a carrier; d) applying one or more protection layers to one or both sides of the electrode; and e) removing the electrode from the carrier.

14 Claims, 8 Drawing Sheets

(1)  (2)  (3)  (4)  (5)  (6)  (7)

(1)  (2)  (3)  (4)  (5)  (6)  (7)  (8)

US 12,388,068 B2

ELECTRODE PRODUCTION PROCESS

CROSS-REFERENCE TO RELATED APPLICATIONS

This application is the National Stage of International Patent Application No. PCT/GB2021/050931, filed Apr. 19, 2021, which claims the benefit of Great Britain Application No. 2005746.9, filed Apr. 20, 2020, the entire contents of both of which are incorporated herein by reference.

The present invention relates to a method of forming an alkali or alkaline earth metal electrode, in particular a lithium electrode. The present invention also relates to alkali and alkaline earth metal electrodes.

BACKGROUND

Electrodes comprising alkali and alkaline earth metals have been used in both primary and secondary electrochemical cells. In particular, lithium has been found to be a desirable material for the formation of electrodes, as it is a lightweight material that can provide a high specific energy. This can enable construction of cells that are suitable for a wide range of applications, including those where minimising the weight of the cell is of great importance. In a lithium-sulphur cell, for instance, lithium metal foil may be used as a negative electrode, or anode.

However, despite the advantages provided by the use of such electrodes, alkali and alkaline earth metals have certain disadvantages when employed in electrochemical cells. Using lithium metal foil as an example, lithium may react with the electrolyte within a cell. This may form a resistive layer over the electrode and decrease battery performance over time. Lithium dendrites and/or mossy deposits may also be formed on the surface of the lithium metal foil during cycling, which can result in short-circuiting and decreased cycling performance, and may ultimately lead to reduction of the lifetime of the cell.

Thus, preventing degradation associated with electrodes comprising alkali or alkaline earth metals may be advantageous. This may be achieved by the application of one or more protection layers on the surface of an electrode. Exemplary protection layers may include alloy layers or ceramic layers. However, production of such coated electrodes may be problematic. For example, cutting an alkali metal foil to form an electrode, after application of a coating to the alkali metal foil, may result in damage such as cracks in the protection layer or layers, thus reducing the effectiveness of the protection layer. This may have a consequent effect on lifetime and cyclability of a cell, for example.

In one method of producing electrodes, a roll-to-roll process is used, which involves starting with a reel of metal foil, for example an alkali metal such as lithium, unwinding the foil to apply the desired coating layer or layers, followed by re-winding the coated foil onto another reel. However, this can result in the introduction of tension into the metal foil and can produce strain on the alkali metal reel, which may result in different thicknesses within the foil. This can in turn result in electrodes without uniform thickness. Stretching of metal foil during a roll-to-roll process may also result in potential damage in the protection layer or layers, which may ultimately result in unprotected regions of the foil.

BRIEF DESCRIPTION OF FIGURES

Various aspects of the invention are described, by way of example, with reference to the accompanying figures, in which.

DESCRIPTION

Figure 1:
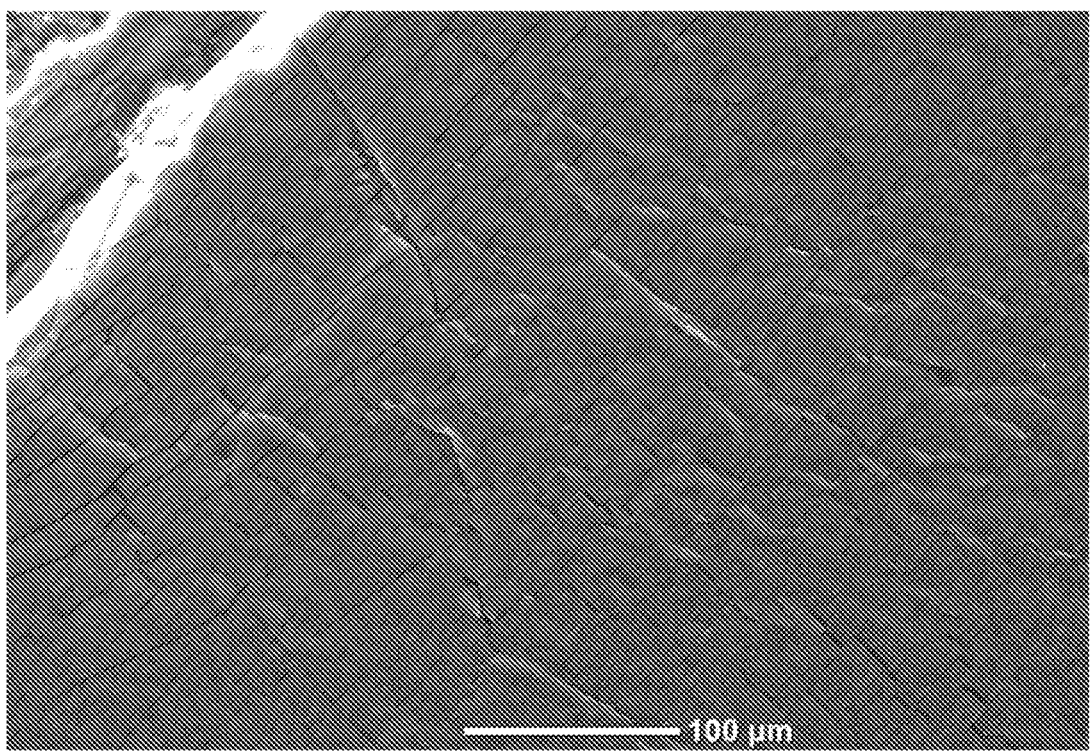
FIG. 1 depicts a lithium electrode that has been cut after application of a protective coating layer.

Before particular examples of the present invention are described, it is to be understood that the present disclosure is not limited to the particular cells, methods or materials disclosed herein. It is also to be understood that the terminology used herein is used for describing particular examples only and is not intended to be limiting, as the scope of protection will be defined by the claims and equivalents thereof.

In describing and claiming the cell and method of the present invention, the following terminology will be used: the singular forms "a", "an" and "the" include plural forms unless the context clearly dictates otherwise. Thus, for example, "a cathode" includes reference to one or more of such elements.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

In accordance with one aspect of the invention, there is provided a method for forming one or more alkali metal or alkaline earth metal electrodes, said method comprising:
  a. providing a metal foil;
  b. cutting the metal foil to form at least one electrode;
  c. placing an electrode on a carrier;
  d. applying one or more protection layers to one or both sides of the electrode; and
  e. removing the electrode from the carrier.

In accordance with another aspect of the invention, there is provided a method for forming at least one alkali metal or alkaline earth metal electrode; said method comprising:
  i. providing a metal foil;
  ii. placing the metal foil on a carrier, wherein at least one side of the metal foil is partially overlapped by either part of the carrier or by a mask, such that the region or regions that are not overlapped by the carrier or mask define the electrochemically active zone of at least one electrode;

iii. coating at least one side of the foil with one or more protection layers, such that the regions overlapped by the carrier and/or mask are not coated;
iv. removing the metal foil from the carrier; and
v. cutting the metal foil to form one or more electrodes, wherein each of said electrodes have an electrochemically active zone coated with one or more protection layers, and wherein the metal is cut along the uncoated regions of the foil.

In accordance with a further aspect of the invention, there is provided a cell comprising one or more electrodes obtainable by one of the methods detailed herein.

In step a) or step i) of the method as described herein, an alkali or alkaline earth metal foil is provided. The alkali metal foil is preferably a lithium metal or metal alloy foil. Alternatively, the alkali metal foil is a sodium metal or metal alloy foil. The alkaline earth metal foil is preferably a magnesium metal or metal alloy foil. Typically, alkali metal or alkaline earth metal foil is provided on a reel. In one embodiment, the step of providing an alkali metal or alkaline earth metal foil comprises unrolling a section of foil from the reel.

For the avoidance of doubt, where "metal foil" is referred to throughout the specification, this may be understood as referring to an alkali metal foil or alkaline earth metal foil, for example a metal foil selected from a lithium metal or metal alloy foil, a sodium metal or metal alloy foil, or a magnesium metal or metal alloy foil. Other alkali metal or alkaline earth metal foils may be understood to be covered also. "Metal foil" is understood to cover both foils comprising alkali metals or alkaline earth metals, in addition to alkali metal alloys and alkaline earth metal alloys.

Any suitable thickness of the alkali or alkaline earth metal foil may be employed. This may be dependent on the application of the resulting electrode. The alkali or alkaline earth metal foil may be a thin film i.e. have a thickness of between 20 µm to 150 µm, preferably between 50 µm to 100 µm, for example between 65 µm to 75 µm.

In step b) of the method described herein, the metal foil is cut to produce one or more electrodes. Cutting of the metal foil may be performed by any suitable method. Examples of methods for cutting include laser cutting, or mechanical cutting such as die cutting or rotary knife slitting.

In one embodiment, the foil is cut to form one or more electrodes before the application of a protection layer or layers. The size of the electrode is dependent on the footprint of the cell in which said electrode will be incorporated. Exemplary electrode dimensions of the main body of the electrode, which comprises the electrochemically active area, are in the range of 0.5 $cm^2$ to 1500 $cm^2$, preferably 30 $cm^2$ to 150 $cm^2$, for example 50 $cm^2$ to 80 $cm^2$. Exemplary lengths of an electrode (inclusive or exclusive of an electrode tab) may be in the range of 1 cm to 30 cm, preferably 5 cm to 25 cm, for example 10 cm to 20 cm. Exemplary electrode widths may be in the range of 1 cm to 40 cm, preferably 5 cm to 30 cm, for example 10 cm to 20 cm.

Typically, the electrode comprises a tab, wherein the tab is a portion of the electrode which does not take part in the electrochemical process during cycling of a cell. The tab may protrude from an edge of the main body of the electrode and is used to form the mechanical base for a weld to a contact lead. In one embodiment, the width of the tab is less than the width of the main portion of the electrode that includes the electrochemically active area. Alternatively, the width of the tab may be the same as that of the main body of the electrode that includes the electrochemically active area. Exemplary dimensions of the electrode tab width are in the range of 0.5 to 5 cm, and exemplary dimensions of the electrode tab length are in the range of 1 to 6 cm. In the method of the present invention, at least a portion of the electrode tab remains uncoated.

Instead of initially cutting the foil to form one or more electrodes (step b)), the foil may initially be cut into sections having dimensions larger than that of a single electrode. For example, where the foil is cut into larger sections, each section may have a width of from 0.1 cm to 100 cm, preferably 10 cm to 75 cm, for example, 25 cm to 50 cm. Each section may have a length of from 0.1 cm to 10,000 cm, preferably 10 cm to 1000 cm, for example 100 cm to 500 cm. For example, each portion may have a width of 4 cm to 15 cm, and a length of from 4 cm to 15 cm. In this embodiment, following application of one or more protection layers, each section of the foil is then subject to a further cutting step, in which the foil is cut to form one or more electrodes, wherein the electrode(s) have dimensions as specified above, and preferably include an electrode tab as detailed above. Initially cutting larger sections and having a further cutting step after the protection layers have been applied may enable easier handing of the metal foil, for example an alkali metal foil such as lithium foil, in particular at the initial pick-and-place and (pre)treatment steps. Cutting the metal foil into sections, and further cutting the foil to form one or more electrodes, may be performed by any suitable method as detailed above.

The present inventors have surprisingly found that the method in accordance with the present invention may provide an improved method for producing alkali metal or alkaline earth metal electrodes, in particular those with a protective coating. Typically, electrodes are cut after electrode coating has been performed. However, this may result in a number of processing difficulties and other disadvantages. For example, where an alkali or alkaline earth metal foil is coated with one or more coating layers, such as protective coating layers, and this coated metal foil is then cut to form one or more electrodes, the cutting process may result in cracks or defects in the coating layers, particularly around the edges of the electrodes. This can be due to the physical/mechanical properties of the alkali or alkaline earth metal foils, such as reactivity and fragility of foils formed of such soft metals. As a result, deformation of the foil during cutting or manipulation may occur. Melting of regions of the foil may also occur, for example around the regions where the foil is cut. Deformation of the foil substrate can also manifest additional stresses and strain to the protection layers during cutting and manipulation, which may result in damage to the protection layer. For example, ceramic coating layers may be brittle and may crack if the substrate (metal foil) is subject to deformation, such as bending or stretching. FIG. 1 depicts part of a coated electrode where cutting of the electrode has taken place after application of the coating layer. Large and small cracks and defects in the coating can be clearly seen.

Cracks or defects in the coating layers of a metal electrode may be disadvantageous, as they may prevent a coating layer from effectively performing a protective function during cycling of a cell comprising said electrode. For example, defects in the coating layers of an alkali metal electrode, for example a lithium anode in a lithium sulfur cell, can allow contact of the metal with the electrolyte, allowing a resistive layer to form on the electrode that may lead to cell drying and/or may decrease battery performance over time, and may also result in the formation of metal dendrites/mossy deposits during cycling. This can result in short-circuiting and decreased cycling performance. Thus, the performance and/or lifetime of such cells may be affected.

Figure 2:
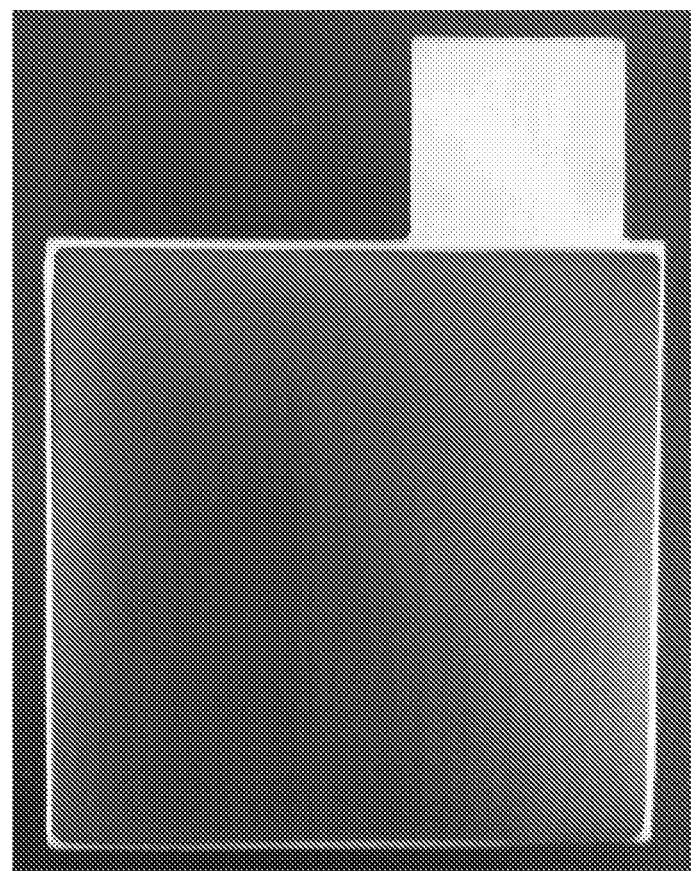
FIG. 2 depicts a lithium electrode produced in accordance with an embodiment of the present invention.
Figure 3:
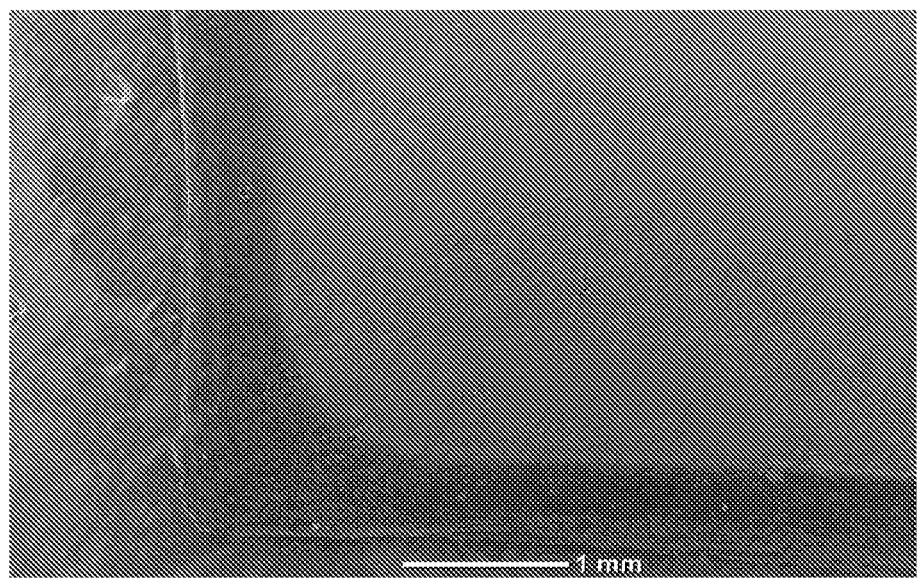
FIG. 3 depicts an SEM image of a protected lithium electrode in accordance with an embodiment of the present invention.

In the present invention, cutting of a protective layer or layers is avoided. In accordance with the aspect of the invention in which the electrodes are cut before the protection layer(s) are applied (steps a) to e)), no further cutting is required after coating. FIG. 2 shows an electrode produced by this method, i.e. the electrode was coated following cutting. In the aspect in which one or more electrodes are cut from a foil onto which protected regions have been applied (steps i) to v)), the step of cutting the electrodes involves cutting along the regions that have been masked during treatment stages, in particular the stages of applying protective coated layers. Thus, cutting of the protection layer(s) is avoided. FIG. 3 is an SEM image of a protected lithium electrode produced by a method in accordance with the present invention.

Prior to the application of one or more protection layers on the metal foil, an electrode may be placed on a carrier (step c)). In one embodiment, a plurality of electrodes is placed on the carrier. Where at least one electrode is placed on a carrier, the electrode or electrodes may lie flat on the carrier. In one embodiment, at least one region of the foil may be covered or masked using a suitable masking system such that, on application of a protection layer, no protection layer will be applied to the covered or masked area. In one embodiment, an electrode is placed on a carrier, wherein the carrier overlaps the edges of the electrode.

The carrier systems and/or masking systems used in accordance with the present invention are in electrical isolation from the chamber in which coating takes place. Either the carrier or masking system may optionally be biased with reference to ground or the deposition sources. Additional masks may be applied to the carrier unit at various stages during the coating process. These may be applied by any suitable method, for example a mask may be clipped onto the carrier, or held or fixed within the deposition chamber during coating. In accordance with embodiments of the invention, the mask or masks may be: electronically conductive and in electronic connection to the carrier; electronically conductive and electronically floating whilst being insulated from the carrier; electronically conductive and biased against the carrier or the source whilst being insulated from the carrier; electronically conductive and electronically grounded whilst being insulated from the carrier; electronically insulating and isolated from the carrier and source.

Figure 4:
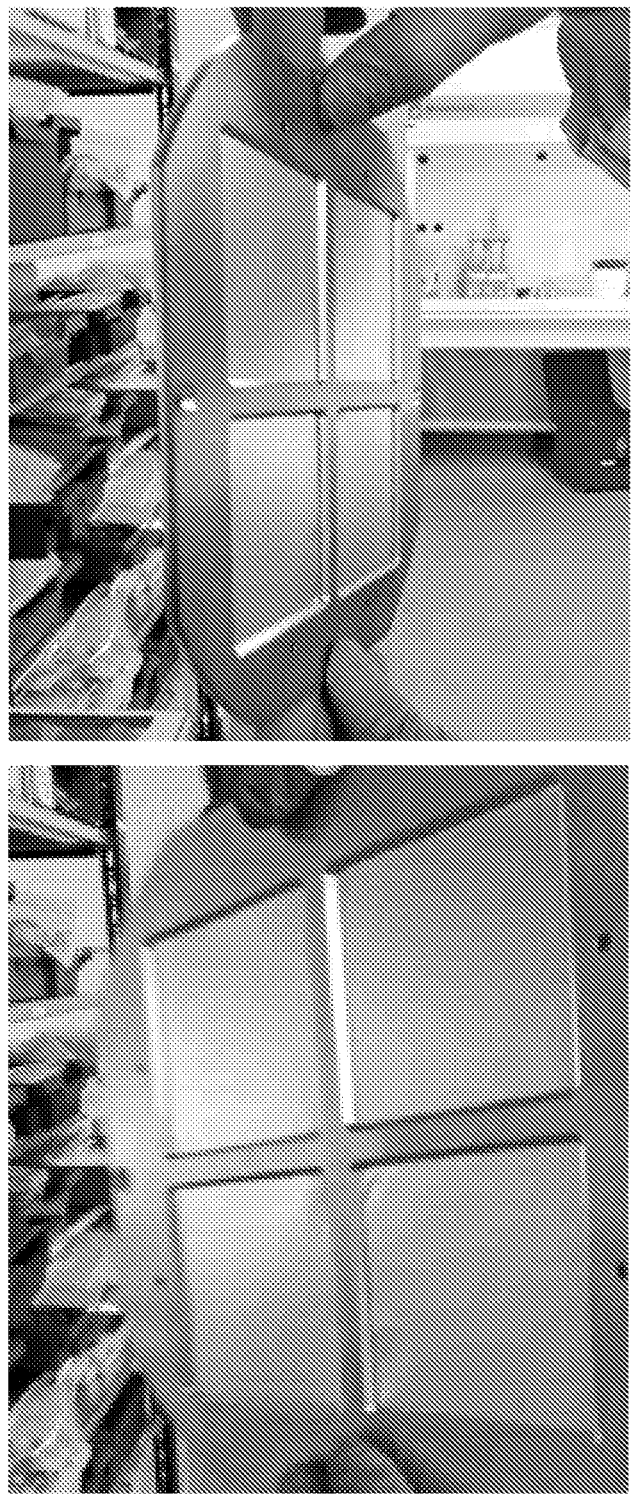
FIG. 4 depicts a carrier used in accordance with an embodiment of the present invention, wherein both sides of the carrier are shown.

In accordance with step ii) as described above, a section of metal foil is inserted into a carrier, wherein the carrier comprises one or more openings, such as between 2 to 100, preferably between 5 to 50, for example between 10 to 20, and wherein each opening defines the electrochemically active zone of an electrode. FIG. 4 depicts a carrier into which a section of metal foil can be inserted.

The carrier may be formed of any suitable material, for example a metal such as aluminium, copper stainless steel. In some embodiments, an appreciably inert coating may be present on the carrier, for example aluminium nitride or a polymer coating such as a polyamide-imide (for example Torlon®).

The carrier can be configured so as to contain one or more electrodes therein. In one embodiment, one electrode is placed on, or inserted in, a carrier. In an alternative embodiment, a plurality of electrodes may be placed on, or inserted in, a single carrier. Alternatively, the carrier is configured so as to contain a section of metal foil therein.

Preferably, the carrier comprises a double-sided masking system, allowing both sides of a metal foil or electrode to be coated simultaneously. In addition, the use of a carrier may enable the metal foil, or the electrodes, to be held in place during pre-treatment and/or coating steps. This can prevent tension (which can occur during a roll to roll process) affecting the metal foil during processing, and can reduce or prevent uneven thickness of the resulting electrode. In addition, contact between the metal foil and the carrier can enable thermal energy exchange between the foil and the carrier. Optionally, the carrier may be in thermal contact with a thermally-controlled heat sink or cooling system. Heating of the foil may be reduced or minimised, for example during pre-treatment or coating steps.

Preferably, the carrier comprises two plates, i.e. one plate that is located on one side of the electrode or metal foil, and one plate that is located on the other side of the electrode or metal foil. The plates may either be attached together, for example using a hinge, or the two plates may not be joined together, and may be attached once the electrode or metal foil has been inserted between them. The plates may be attached by any suitable means, for example a clasp or locking arrangement. In one example, the locking arrangement may comprise screws that extend through the plates. Each plate comprises one or more openings. Each opening defines an electrochemically active zone of an electrode. Alignment pins may be included within the carrier so as to ensure alignment of the plates on each side of the carrier, thus ensuring substantial alignment of the openings on each side of the carrier. In this embodiment, the electrode or metal foil is held in place in the carrier. Optionally, pressure may be applied to at least a region of the electrode or metal foil overlapped by the carrier. For example, where an electrode is present in the carrier, pressure may be applied in the tab region of the electrode. This pressure may be useful to enable good thermal connection between the electrode/foil, the carrier and a heat sink or cooling system.

Additionally or alternatively, masking may be performed by use of a "shadow" masking system. In this embodiment, the edges of the electrode are overlapped by a mask that is not affixed to the carrier. In this masking system, a mask may be present between the electrode and the source of coating material. For example, the mask may be held or suspended in between the carrier and the coating source, and may take the form of a plate as described above. However, the mask is not attached to the carrier, and does not hold the electrode in place during coating. In this masking system, the edges of the electrode are overlapped by the mask such that the edges of the electrode remain uncoated.

Where the metal foil has been cut to form an electrode (step b)), each electrode may be placed in an individual carrier, wherein the carrier comprises two plates that are positioned on each side of the electrode. Each plate preferably has an opening that defines the electrochemically active zone of the electrode. When the electrode is placed in the carrier, the openings of each plate are preferably aligned such that the exposed areas on each side of the electrode are substantially aligned with each other. Consequently, on application of one or more protection layers to the electrode, the exposed areas of the electrode, i.e. those that form the electrochemically active zone as defined by the opening, are coated.

The carrier may overlap an edge region of the electrode. Preferably, this overlapping region extends around the entirety of the outer perimeter of the electrode. During application of one or more protection layers to the electrode, the overlapped region of the electrode is not coated, as this region is masked by the carrier. The electrode tab is additionally masked by the carrier, and is not coated with the protection layer(s). Following coating (step d)), the protection layers on each side of the electrode are substantially aligned with each other.

Figure 5:
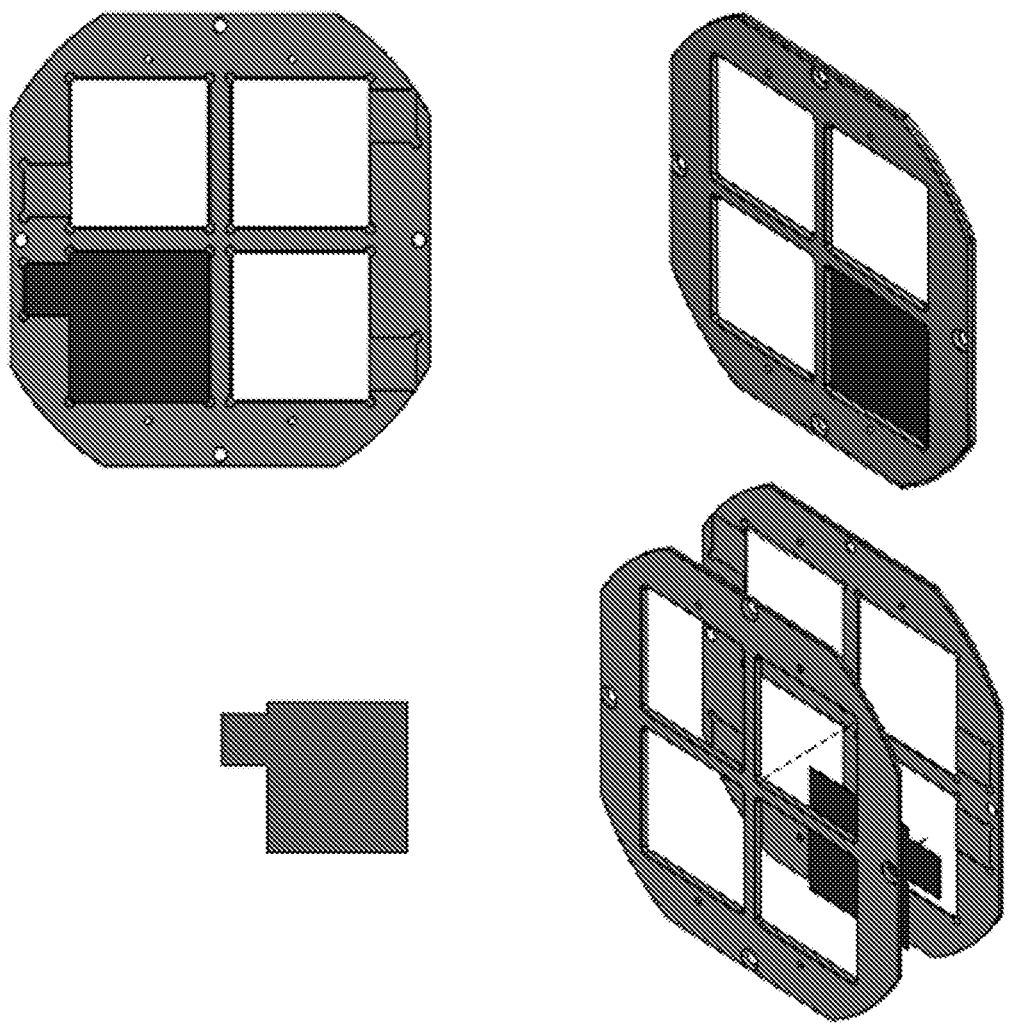
FIG. 5 depicts a carrier for use in a method in accordance with an embodiment of the present invention.

Alternatively, a plurality of electrodes may be placed on or in a single carrier, wherein each side of the carrier has a plurality of openings that each define the electrochemically active zone of one electrode. Each opening is substantially aligned with an opening on the other side of the carrier, such that the exposed areas on each side of each electrode are substantially aligned when one or more electrodes are placed in the carrier. Consequently, on application of one or more protection layers to the one or more electrodes present in the carrier, the exposed areas of each electrode, i.e. those that form the electrochemically active zone as defined by the opening, are coated. Following treatment stages, the resulting protection layers on both sides of each electrode are substantially aligned with each other. FIG. 5 shows an arrangement in which four electrodes may be placed in a single carrier.

Alternatively, a section of metal foil may be placed in a carrier, wherein at least one side of the carrier has a plurality of openings that each define the electrochemically active zone of one electrode. Each opening is substantially aligned with an opening on the other side of the carrier, such that exposed areas on each side of the metal foil are substantially aligned when the foil is placed in the carrier. In one embodiment, the section of metal foil is held in place in a carrier comprising two plates as detailed above. In another embodiment, the section of metal foil is place on a carrier and a "shadow" mask is used to overlap or cover the areas of metal foil that do not define the electrochemically active zone of the resulting electrode or electrodes. Consequently, on application of one or more protection layers to the metal foil present in the carrier, the exposed areas of the foil, i.e. the areas that form the electrochemically active zone of discrete electrodes, are coated. Following coating, the exposed, coated areas on each side of the metal foil are substantially aligned with each other. In between the coated areas are uncoated areas that were covered by the carrier during application of the protection layer. Following removal of the metal foil from the carrier (step iv)) the metal foil is cut to form one or more electrodes (step v)). Each of said one or more electrodes has an electrochemically active zone coated with one or more protection layers. An electrochemically active zone may be present on either one or two sides of each electrode. Preferably, an electrochemically active zone is present on both sides of the electrode. The metal foil is cut along the uncoated areas of the foil, i.e. the areas that were covered or masked by the carrier. Thus, the coated areas of the foil are not cut. No damage to the protection layer results from cutting. Following cutting, each electrode may have an outer region that is not coated with a protection layer. The dimensions of the outer, uncoated region may vary; for example, the uncoated region following cutting may extend from between 0.01 mm and 20 mm. The dimensions of the uncoated region may vary around of the perimeter of the electrode. Preferably, the uncoated region extends around the entire perimeter of the electrode. Preferably, the uncoated region is present on both sides of the electrode.

Alternatively, where one or more electrodes is placed on a carrier, i.e. where the electrode or electrodes lies flat on a carrier and wherein the top of the electrode or electrodes is not partially covered, the entire upper surface of the electrode or electrodes may be coated. In this embodiment, the coated electrode does not have an outer edge region that is not coated with a protection layer. Following coating of the upper surface of the electrode, the electrode may be turned such that the other surface of the electrode may be coated.

Optionally, following production of one or more coated electrodes, the outer electrode region that is not coated with the protection layer may be coated with an electronically and ionically insulating material to render it inactive when the electrode is included within an electrochemical cell. Preferably, the electrode tab is not coated with an insulating material. In one embodiment, an insulating material such as an insulating polymer may be applied to the uncoated edge region by, for example, spray coating or printing. An optional thermal or curing step may be performed after the application of insulation material. This step may serve to polymerise the insulating material.

Additionally or alternatively, when the electrode is in situ in an electrochemical cell, the outer, uncoated electrode region may be inactive due to the relative dimensions of the positive and negative electrodes. For example, a coated anode having an outer, uncoated region may be matched with a cathode of a smaller area, such that the electrochemically active area of the cathode is matched with only the electrochemically active, coated area of the anode. The uncoated, outer region is not aligned with the electrochemically active area of the cathode.

As detailed above, the carrier may comprise one or more openings that define an electrochemically active zone of an electrode. During application of one or more protection layers, the exposed areas of the metal foil/electrode, i.e. the areas not covered by the carrier or masking system (for example, by a shadow mask), are coated. The areas of the metal foil/electrode that are covered by the carrier remain uncoated. At least one region of the electrode is overlapped or covered by the carrier. Where a single electrode is placed in an individual carrier, the edges of the electrode are preferably covered by the carrier on each side (i.e. the upper and lower side) of the electrode. In one embodiment, an area of length of between 0.01 mm and 20 mm, preferably between 0.1 mm and 10 mm, for example between 0.5 and 1 mm extending from the edge of the main body of the electrode is covered by the carrier.

Where the electrode has been cut before coating (step b)), the electrode tab, or a portion of the electrode tab, is preferably overlapped by the carrier or masking system. During application of a protection layer or layers, the electrode tab, or covered portion of the electrode tab, is not exposed to the material applied during coating, and therefore remains uncoated by a protection layer. In avoiding the formation of a protection layer on at least a portion of the electrode tab, better mechanical and/or electrical contact between the electrode tab and a contact lead may be achieved.

At least one region of the electrode body is overlapped by the carrier, as described above. FIG. 2 shows a protected electrode produced by the process in accordance with the present invention. In FIG. 2, the electrode tab is formed of lithium that is not coated by a protection layer. A region of the electrode body is coated with a protection layer. The perimeter of the electrode body is not coated by the protection layer. The uncoated regions of the electrode were covered by the carrier system during application of the protection layer(s). In FIG. 2, no damage to the coating is evident. It will be understood that the other side of the electrode (not visible in FIG. 2) has equivalent regions that are coated/uncoated.

The electrode may be coated with any suitable protection layer. At least one or more coating layers may be envisaged. This coating may form an anode protection layer. Such an anode coating layer may have beneficial effects on cell performance, for example by reducing inhomogeneous stripping and plating of alkali metal present in the anode, which may reduce cracks or voids in the anode surface and may provide improvements in cycling and capacity life. The thickness of each coating layer may be between 1 nm and 5000 nm, preferably between 10 nm and 3000 nm, more preferably between 100 nm and 1000 nm, for example between 100 nm and 500 nm. Preferably, both sides of the electrode (or both sides of the metal foil from which one or more electrodes is produced) are coated. In one embodiment, both sides are coated simultaneously. In another embodiment, a coating layer or layers is first applied to one side of the electrode (or metal foil). Following this initial application step, a coating layer or layers is then applied to the other side of the electrode or foil.

For example, one or more coating layers comprising at least one metal and/or non-metal that can form an alloy with an alkali metal such as lithium or sodium may be employed. The term "alloy" refers to a combination of two or more metals, or a combination of one or more metals with other, non-metallic elements. Examples of suitable alloying metals and non-metals include aluminium, gallium, boron, indium, zinc, carbon, silicon, germanium, tin, lead, antimony, silver, gold, sodium, potassium, magnesium, calcium, palladium, platinum and mixtures thereof. The thickness of the coating layer comprising at least one metal and/or non-metal that can form an alloy with an alkali metal such as lithium or sodium may be between 1 nm and 5000 nm, preferably between 10 nm and 3000 nm, for example between 100 nm and 1000 nm. In one embodiment, a coating layer comprising at least one metal and/or non-metal that can form an alloy with an alkali metal is deposited directly on the electroactive active alkali metal layer.

Additionally or alternatively, one or more ionically conducting coating layers may be applied to the electrode, either directly on an electroactive active alkali metal layer, or on top of a further coating layer. Said ionically conducting coating layer may have an electronic conductivity of less than $10^{-5}$ S cm$^{-1}$. Thus, this layer may have a low electronic conductivity, i.e. be substantially electronically insulating. The inclusion of a layer with a low electronic conductivity may avoid deposition of alkali metal ions such as Li$^+$ and Na$^+$ on top of a layer comprising at least one metal and/or non-metal that can form an alloy with an alkali metal such as lithium or sodium, where such a layer is present between the ionically conducting coating layer and the anode. Low electronic conductivity may also serve to prevent the ionically conducting coating layer from effectively working as a further current collector within the cell. The ionically conducting coating layer may have an electronic conductivity of less than $10^{-5}$ S cm$^{-1}$, preferably less than $10^{-8}$ S cm$^{-1}$, more preferably less than $10^{-10}$ S cm$^{-1}$. In one example the electronic conductivity is less than $10^{-12}$ S cm$^{-1}$. Said ionically conducting coating layer may have a thickness of between 1 nm and 5000 nm, preferably between 10 nm and 1000 nm, for example between 100 nm and 500 nm.

The ionically conducting coating layer may comprise at least one of a ceramic or glass material, a polymer material, a polymer and ceramic composite material, and combinations thereof. Suitable ceramic or glass materials include, for example, one or more elements selected from lithium, sodium, magnesium, oxygen, phosphorous, nitrogen, silicon, germanium, titanium, zirconium, tin, aluminium, sulfur, boron, selenium, fluorine, chlorine, bromine or iodine. Suitable ceramic materials may be stoichiometric or non-stoichiometric. The ceramic material may be an oxynitride, sulphide, phosphate, oxide, oxysulfide, thiophosphate, borate, oxyborate, borohydride, silicate, aluminate or thioaluminate compound, or a combination thereof. Examples of suitable materials include lithium oxynitride, lithium sulphide, lithium phosphate, lithium oxide, lithium oxysulfide, lithium thiophosphate, lithium borate, lithium oxyborate, lithium borohydride, lithium silicate, lithium aluminate and lithium thioaluminate, or combinations thereof. Alternatively, the material may be selected from one or more of sodium oxynitride, sodium sulphide, sodium phosphate, sodium oxide, sodium oxysulfide, sodium thiophosphate, sodium borate, sodium oxyborate, sodium borohydride, sodium silicate, sodium aluminate and sodium thioaluminate. The ceramic material may be an amorphous material.

The ionically conducting coating layer may comprise a conductive polymer material, for example an ionically conductive polymer. Additionally or alternatively, the ionically conducting coating layer may comprise a polymer material having an alkali metal salt distributed within the polymer material. This may provide or increase ionic conductivity within the polymer. The ionically conducting coating layer may instead or additionally comprise a polymer-ceramic composite material. A polymer-ceramic composite material may comprise ceramic particles that are bound together by at least one polymer material. The polymer or polymers used to form the polymer-ceramic composite material may have inherent alkali metal ion conductivity, or may be mixed with alkali metal salts.

For example, the polymer material may comprise a lithium salt (e.g. LiTFSI) dissolved within a polymer phase, for example polyethylene oxide. Further examples of lithium salts include lithium hexafluorophosphate, lithium hexafluoroarsenate, lithium nitrate, lithium perchlorate, lithium trifluoromethanesulfonimide, lithium bis(oxalate) borate and lithium trifluoromethanesulphonate. Suitable sodium salts include sodium hexafluorophosphate, sodium hexafluoroarsenate, sodium nitrate, sodium perchlorate, sodium trifluoromethanesulfonimide, sodium bis(oxalate) borate and sodium trifluoromethanesulphonate. Combinations of salts may be employed.

The polymer may comprise at least one functional group selected from the list of amine, amide, carbonyl, carboxyl, ether, thioether and hydroxyl groups, and mixtures thereof. Non-limiting examples of polymers include polyanhydrides, polyketones, polyesters, polystryenes, polyamides, polyimides, polyurethanes, polyolefins, polyvinylenes. Non-limiting examples of ionically conductive polymers may include nitrogen or sulfur containing polymers, for example polypyrroles (PPY), polycarbazoles, polyindoles, polyazepines, polyanilines, polythiophenes, PEDOT, PPS. Further examples of ionically conductive polymers may include poly(fluorene)s, polyphenylenes, polypyrenes, polyazulenes, polynaphthalenes, poly(acetylene)s (PAC) and poly(p-phenylene vinylene) (PPV). In a preferred embodiment, the polymer material is polyethylene oxide.

In a preferred embodiment, the electrode is coated with a first layer comprising a metal and/or non-metal that alloys with an alkali metal, and a second layer deposited on the first layer, wherein the second layer is an ionically conducting layer having an electronic conductivity of less than $10^{-5}$ S cm$^{-1}$, wherein the first and second layers are as detailed above. Coatings comprising more than one of either the layer comprising a metal and/or non-metal that alloys with an alkali metal, or the ionically conducting layer, may be envisaged. Additional layers may also be included.

Any suitable method may be used to form the coating layer or layers. Examples of suitable methods include physical or chemical deposition methods, such as physical or chemical vapour deposition. For example, plasma-enhanced chemical vapour deposition, sputtering, evaporation, electron-beam evaporation, pulsed laser deposition and chemical vapour deposition (CVD) may be used. Alternative methods of forming coating layers may include ink-jet printing, screen printing, slot die and spray coating. Following deposition of each of the coating layers, drying may be performed.

In advance of the application of the one or more coating layers, a pre-treatment step may be performed on the metal foil, or on an electrode. Pre-treatment may be used to remove or reduce the impurities present on the surface a metal foil, in particular an alkali metal foil such as lithium or sodium. This pre-treatment step can prepare the metal surface for the coating step. For example, pre-treatment may improve the interfacial characteristics of the electrode, such as ensuring better adhesion of the first coating layer to the alkali metal foil. For example, pre-treatment of a metal foil, such as an alkali metal foil, may involve contacting the foil with a reactive gas or gas mixture. Examples include $H_2$, $CO_2$, $N_2$, $O_2$, $SO_2$, $H_2O$, $H_2S$, $Cl_2$, $F_2$, $POCl_3$, and $PH_3$. Alternatively, pre-treatment may involve contacting a metal foil (e.g. an alkali metal foil) with a solvent, for example an organic solvent such as heptane or hexane, or an ionic solvent such as 1-Butyl-3-methylimidazolium hexafluorophosphate. Plasma cleaning may also be employed. Pre-treatment may be performed under reduced pressure or under vacuum conditions. Any one or more of said pre-treatments may be employed before application of the first coating layer. A pre-treatment step may be performed at any suitable time before coating, for example any one or more of said pre-treatments may be employed prior to insertion of the electrode/foil into the carrier, and/or following insertion into the carrier. In one embodiment of the present invention, plasma cleaning is preferably performed under vacuum, before the carrier is transferred under vacuum into a treatment zone wherein one or more protection layers are applied.

In accordance with one embodiment of the present invention, the following method is used to produce one or more electrodes:

Thin (e.g. 20-150 μM) metal foil (e.g. lithium foil) is cut into the desired electrode footprint by means of a suitable technique, for example laser or mechanical cutting. Optionally, a pre-treatment step may be performed to prepare the surface of the electrode for the coating step.

The cut and optionally pre-treated electrode is loaded into a carrier such that both faces of the intended electrochemically active area of the electrode are exposed, and wherein the rest of the electrode is masked.

The carrier containing the electrode is passed through multiple treatment zones where the electrode is treated. First, an optional pre-treatment step may be performed in order to prepare the electrode surface for the coating step. This pre-treatment step may include various processes and environments (solvent, vacuum, reactive gas etc). The final pre-treatment step is performed under vacuum, involving applying a plasma cleaning process. Then the carrier is transferred under vacuum into a treatment zone where one or more protective layers are applied under vacuum to the surface of the electrode.

The carrier is removed from the vacuum, and the electrode, comprising one or more protection layers, is unloaded from the carrier. The electrode is then picked and placed for cell build. An optional step of coating the uncoated edge regions of the electrode with an insulating polymer may be performed prior to cell build. An additional thermal/curing step may also be performed.

Figure 6:
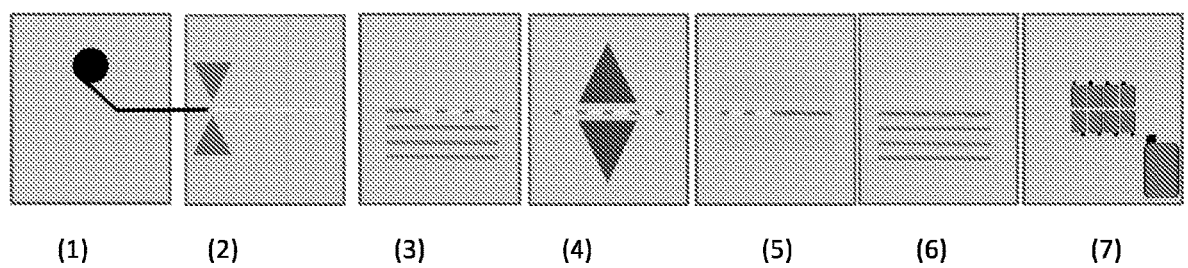
FIG. 6 provides a schematic representation of a method of forming one or more lithium electrodes in accordance with an embodiment of the invention.

FIG. 6 provides a schematic representation of a method in accordance with an embodiment of the present invention. Said method includes the following steps: 1) unwinding a reel of Li foil; 2) cutting Li electrodes; 3) pick & place of Li electrodes on substrate carrier/masking system; 4) and 5) pre-treatment and coating deposition on Li electrodes within, for example, a vacuum system; 6) and 7) pick & place of the protected Li electrodes for cell build. Said method may be similarly applied to the production of an alternative alkali metal electrode, such as sodium. In this case, step 1) would comprise unwinding an Na reel. Said method may be similarly applied to the production of a magnesium metal electrode, in which case step 1) would comprise unwinding an Mg reel.

In accordance with another embodiment of the present invention, the following method is used to produce one or more electrodes:

Thin (e.g. 20-150 micron) metal foil (e.g. lithium foil) is cut into the desired footprint by means of a suitable technique, for example laser or mechanical cutting, wherein the desired footprint is a section of foil that is larger than a single electrode. Optionally, a pre-treatment step may be performed to prepare the surface of the foil for the coating step.

The section of foil is loaded into a carrier such that openings on each side of the carrier define intended electrochemically active areas of one or more electrodes, wherein the intended electrochemically active areas are exposed and the rest of the foil is masked.

The carrier containing the foil is passed through multiple treatment zones where the exposed areas of the foil are treated. First, an optional pre-treatment step may be performed in order to prepare the surface for the coating step. This pre-treatment step may include various processes and environments (solvent, vacuum, reactive gas etc). The final pre-treatment step is performed under vacuum, involving applying a plasma cleaning process. Then the carrier is transferred under vacuum into a treatment zone where one or more protective layers are applied under vacuum to the exposed areas of the foil.

The carrier is removed from the vacuum, and the foil, comprising one or more protection layers in areas that define the electrochemically active areas of one or more electrodes, is unloaded from the carrier.

The foil is cut to provide one or more electrodes having a desired electrode footprint, by cutting along the uncoated regions of the foil.

The electrodes are then picked and placed for cell build. An optional step of coating the uncoated edge regions of the electrodes with an insulating polymer may be performed prior to cell build. An additional thermal/curing step may also be performed.

Figure 7:
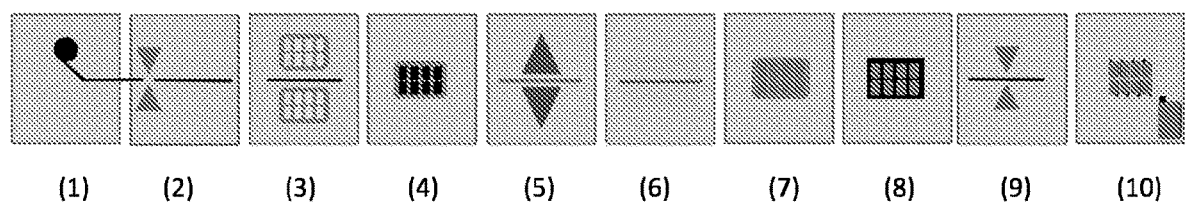
FIG. 7 provides a schematic representation of a method of forming one or more lithium electrodes in accordance with a further embodiment of the invention.

FIG. 7 provides a schematic representation of a method in accordance with another embodiment of the present invention. Said method includes the following steps: 1) unwinding a reel of Li foil; 2) cutting sections of Li foil (optional); 3 and 4) pick and place of Li foil section on substrate carrier/masking system; 5) pre-treatment and 6) coating deposition on Li foil section within, for example, a vacuum system; 7 and 8) removal of carrier/masking system; 9) cutting protected electrodes from Li foil section; 10) pick & place of the protected Li electrodes for cell build. Said method may be similarly applied to the production of an alternative alkali metal electrode, such as sodium, or an alkaline earth metal electrode such as magnesium. In this case, step 1) would comprise unwinding an Na reel, or an Mg reel.

Figure 8:
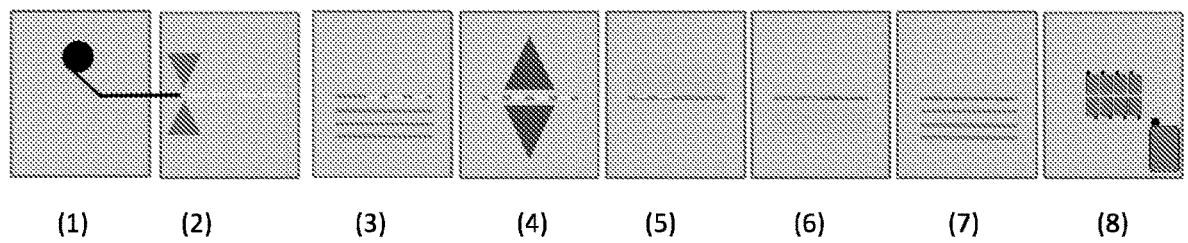
FIG. 8 provides a schematic representation of a method of forming one or more lithium electrodes in accordance with a further embodiment of the invention.

FIG. 8 provides a schematic representation of a method in accordance with a further embodiment of the present invention. Said method includes the following steps: 1) unwinding a reel of Li foil; 2) cutting Li electrodes; 3) placing one or more electrodes on a carrier; 4), 5) and 6) pre-treatment and coating deposition on Li electrodes within, for example, a vacuum system, wherein first one side and then the opposing side of the electrodes are coated; 7) and 8) pick and place of the protected Li electrodes for cell build.

The electrode formed in accordance with the present invention may be included in an electrochemical cell. The electrochemical cell may be any suitable alkali metal or alkaline earth metal-based cell. Preferably, the electrode is employed as a negative electrode (anode). The negative electrode may be coupled with various positive electrode materials, and may in particular be coupled to any high energy cathode. Non-limiting examples of electrochemical cells include a lithium or sodium-sulfur cell, lithium or sodium ion cell (for example a lithium or sodium-NMC cell), or a lithium or sodium-air cell (for example, a lithium or sodium $O_2$ cell). Preferably, the secondary/rechargeable electrochemical cell is a lithium-sulfur or lithium-ion cell. Alternatively, the cell may comprise an alkaline earth metal such as magnesium instead of lithium or sodium. Each electrochemical cell may comprise an anode and a cathode, and a liquid or solid electrolyte present between the anode and the cathode. The electrodes formed in accordance with the present invention may be employed in all-solid state electrochemical cells, as well as cells including liquid electrolytes.

According to an embodiment of the invention there is provided a lithium-sulfur cell comprising an anode produced by the process described herein, a cathode and an electrolyte. Optionally, a separator may be positioned between the cathode and the anode. For example, when assembling the cell, a separator may be placed on the cathode and an anode placed on the separator. Electrolyte may then be introduced into the assembled cell to wet the cathode and separator. Alternatively, the electrolyte may be applied to the separator, for example, by coating or spraying before the anode is placed on the separator. The separator may be formed of a mesh formed of a polymeric material, for example polypropylene, nylon and polyethylene.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. A method for forming at least one alkali metal or alkaline earth metal electrode, said method comprising:
   a) providing an alkali or alkaline earth metal foil;
   b) cutting the metal foil to form at least one alkali or alkaline earth metal electrode;
   c) placing the at least one alkali metal or alkaline earth metal electrode on a carrier,
   wherein the carrier comprises two plates and wherein either one plate, or both plates, comprises at least one opening defining an electrochemical zone of the electrode; and
   wherein the at least one alkali or alkaline earth metal electrode is placed between the two plates such that an inner region of each electrode is exposed and an outer region of the electrode is overlapped by the carrier;
   d) applying one or more protection layers to one or both sides of the electrode; and
   e) removing the electrode from the carrier.

2. The method according to claim 1, wherein a plurality of electrodes is placed on the carrier.

3. The method according to claim 1, wherein each electrode comprises an electrode tab.

4. The method according to claim 1, wherein the electrode has a length of between 1 cm and 30 cm and a width of between 1 cm and 40 cm.

5. The method according to claim 1 wherein the carrier is formed of a metal.

6. The method according to claim 5, wherein the metal is stainless steel, copper, or aluminum.

7. The method according to claim 1, wherein the region of overlap of the carrier on the electrode extends from between 0.01 mm and 20 mm from the edge of the electrode.

8. The method according to claim 1,
   wherein both plates comprise at least one opening defining an electrochemical zone;
   wherein the openings on each plate are substantially aligned with one another such that each electrode has an exposed area defining an electrochemical zone on both sides, and wherein said exposed areas are substantially aligned with one another; and
   wherein a coating layer is applied to both sides of the electrode simultaneously.

9. The method according to claim 1, wherein said one or more protection layers are selected from:
   i. a layer comprising at least one metal or non-metal selected from aluminium, boron, zinc, gallium, indium, carbon, silicon, germanium, tin, lead, antimony, silver, gold, sodium, potassium, magnesium, calcium, platinum, palladium and mixtures thereof, preferably indium or zinc;
   ii. a layer comprising at least one of a ceramic material, a polymer material, a polymer and ceramic composite material, and mixtures thereof; or
   iii. combinations thereof.

10. The method according to claim 9, wherein the alkali metal foil is coated with a first layer comprising at least one metal or non-metal selected from aluminium, boron, zinc, gallium, indium, carbon, silicon, germanium, tin, lead, antimony, silver, gold, sodium, potassium, magnesium, calcium, platinum, palladium and mixtures thereof, followed by a second layer comprising at least one of a ceramic material, a polymer material, a polymer and ceramic composite material, and mixtures thereof.

11. The method according to claim 1, wherein the method further includes one or more pre-treatment steps before said one or more protection layers are applied.

12. The method according to claim 11, wherein the pre-treatment steps are performed after the electrode has been inserted in the carrier.

13. The method according to claim 11, wherein the pre-treatment step includes application of a solvent, gas or plasma to the electrochemical zone.

14. The method according to claim 1, wherein the alkali metal or alkaline earth metal is selected from lithium, sodium or magnesium.

* * * * *